US010088546B2

(12) United States Patent
Gao et al.

(10) Patent No.: US 10,088,546 B2
(45) Date of Patent: Oct. 2, 2018

(54) METHOD AND APPARATUS TO DIAGNOSE CURRENT SENSOR POLARITIES AND PHASE ASSOCIATIONS FOR A THREE-PHASE ELECTRIC POWER SYSTEM

(71) Applicant: EATON CORPORATION, Cleveland, OH (US)

(72) Inventors: Zhi Gao, Coraopolis, PA (US); Brian Zachary Zaremski, Pittsburgh, PA (US); Alan Kenji Hayashi, Avalon, PA (US)

(73) Assignee: EATON INTELLIGENT POWER LIMITED, Dublin 4 (IE)

(*) Notice: Subject to any disclaimer, the term of this patent is extended or adjusted under 35 U.S.C. 154(b) by 136 days.

(21) Appl. No.: 14/267,451

(22) Filed: May 1, 2014

(65) Prior Publication Data

US 2015/0042311 A1 Feb. 12, 2015

Related U.S. Application Data

(60) Provisional application No. 61/864,027, filed on Aug. 9, 2013.

(51) Int. Cl.
*G01R 19/00* (2006.01)
*G01R 29/16* (2006.01)
(Continued)

(52) U.S. Cl.
CPC ......... *G01R 35/005* (2013.01); *G01R 21/133* (2013.01); *G01R 31/041* (2013.01)

(58) Field of Classification Search
CPC .... G01R 29/16; G01R 19/2513; G01R 25/00; H01H 33/027
(Continued)

(56) References Cited

U.S. PATENT DOCUMENTS 3,024,416 A * 3/1962 Becker .................. G01R 11/52 324/107
5,301,121 A 4/1994 Garverick et al.
(Continued)

FOREIGN PATENT DOCUMENTS

EP 0 887 650 A1 12/1998
EP 1 457 785 A2 9/2004

OTHER PUBLICATIONS

Anonymous, "Ge kV2c TM Encompass Electronic Meter", Jul. 1, 2003, 103 pp.
(Continued)

*Primary Examiner* — Giovanni Astacio-Oquendo
(74) *Attorney, Agent, or Firm* — Eckert Seamans

(57) ABSTRACT

A system for a three-phase electric power system includes a plurality of voltage sensors sensing three-phase voltages of the three-phase electric power system; a plurality of current sensors sensing three-phase currents of the three-phase electric power system; and a number of analog-to-digital converters converting the sensed three-phase voltages and the sensed three-phase currents of the three-phase electric power system to corresponding digital values. A processor calculates from the corresponding digital values at least two phase angles between voltage and current for at least two of three phases of the three-phase electric power system, diagnoses polarities and phase associations for at least two of the current sensors based on, for each of the at least two current sensors, a predetermined wiring configuration of the three-phase electric power system and a corresponding one of the at least two phase angles being within a corresponding predetermined angular range, and outputs corresponding diagnosis results.

21 Claims, 11 Drawing Sheets

START
VOLTAGE SENSORS 2
CURRENT SENSORS 4
VOLTAGE MEASUREMENTS
CURRENT MEASUREMENTS
ANALOG TO DIGITAL CONVERTERS
IN OUT 6
IN OUT 8
VOLTAGE SAMPLES 20
CURRENT SAMPLES 22
10 PHASE ANGLE BETWEEN VOLTAGE AND CURRENT
CURRENT SENSOR DIAGNOSIS 12
18 PROCESSOR
14 WIRING CONFIGURATION
DIAGNOSIS RESULTS 16
END

(51) Int. Cl.
*G01R 35/00* (2006.01)
*G01R 21/133* (2006.01)
*G01R 31/04* (2006.01)

(58) Field of Classification Search
USPC ............ 324/107, 76.11, 76.52, 76.59, 76.61, 324/76.77; 702/57, 60
See application file for complete search history.

(56) References Cited

U.S. PATENT DOCUMENTS

| | | | | |
|---|---|---|---|---|
| 5,631,554 | A | 5/1997 | Briese et al. | |
| 6,043,642 | A | 3/2000 | Martin et al. | |
| 6,112,159 | A | 8/2000 | Bond et al. | |
| 6,459,258 | B1 | 10/2002 | Lavoie et al. | |
| 7,528,595 | B2 | 5/2009 | Long | |
| 7,660,776 | B1 | 2/2010 | Kious | |
| 7,728,600 | B2 * | 6/2010 | Wahlroos | G01R 31/086 324/500 |
| 7,994,798 | B2 * | 8/2011 | Williams | G01R 31/2829 318/139 |
| 7,999,532 | B2 | 8/2011 | Briese et al. | |
| 8,159,229 | B2 * | 4/2012 | Akke | H02H 3/402 324/521 |
| 8,212,687 | B2 * | 7/2012 | Makinson | G01D 4/004 324/110 |
| 8,698,487 | B2 * | 4/2014 | Holdsclaw | G01R 19/2513 324/140 R |
| 8,963,556 | B2 * | 2/2015 | Sharma | G01R 31/024 324/509 |
| 2009/0055031 | A1 * | 2/2009 | Slota | H02J 3/42 700/287 |
| 2009/0069980 | A1 * | 3/2009 | Sakamaki | B62D 5/046 701/42 |
| 2010/0090684 | A1 * | 4/2010 | Chen | G01R 15/202 324/117 H |
| 2010/0295491 | A1 * | 11/2010 | Schulz | G01R 31/346 318/490 |
| 2012/0089354 | A1 * | 4/2012 | Holdsclaw | G01R 22/10 702/64 |
| 2013/0320903 | A1 * | 12/2013 | Aalund | G01R 31/343 318/490 |
| 2014/0072950 | A1 * | 3/2014 | Fu | G09B 23/18 434/379 |
| 2018/0143037 | A1 * | 5/2018 | Kamel | G01D 4/002 |

OTHER PUBLICATIONS

European Patent Office, "International Search Report and Written Opinion", dated Sep. 3, 2014, 11 pp.

* cited by examiner

| | REAL POWER | REACTIVE POWER | APPARENT POWER | Φ | EXPECTED RANGE | INDICATED CT |
|---|---|---|---|---|---|---|
| PHASE A | 205 | 110 | 232 | 28.22 | YES | Ia |
| PHASE B | 196 | 100 | 220 | 27.03 | YES | Ib |
| PHASE C | 199 | 16 | 190 | 4.60 | YES | Ic |

METHOD AND APPARATUS TO DIAGNOSE CURRENT SENSOR POLARITIES AND PHASE ASSOCIATIONS FOR A THREE-PHASE ELECTRIC POWER SYSTEM

CROSS REFERENCE TO RELATED APPLICATION

This application claims the benefit of U.S. Provisional Patent Application Ser. No. 61/864,027, filed Aug. 9, 2013, which is incorporated by reference herein.

BACKGROUND

Field

The disclosed concept pertains generally to three-phase electric power systems and, more particularly, to diagnosing polarities and phase associations of current sensors under different wiring configurations for electric power or energy meters or protective relays used in three-phase electric power systems.

Background Information

In electric power system metering and protective relaying applications, it is critical that current sensors be configured correctly. Incorrect configurations of current sensors often involve current sensors having reversed polarities or being associated with wrong phases. Such incorrect current sensor configurations lead to incorrect metered electric power and energy values, or malfunctions in protective relays.

A conventional approach for diagnosing current sensors' polarities and phase associations is based on three-phase sums of real, reactive or apparent power quantities. By collecting voltage and current measurements from three-phase electric power systems, the three-phase sums of real, reactive and apparent power quantities are either directly measured or calculated. Current sensors' polarities and phase associations are then determined based on the three-phase sums of real, reactive or apparent power quantities.

Different combinations of current sensors' polarities and phase associations may result in identical three-phase sums of real, reactive and apparent power quantities. Therefore, the conventional approach sometimes is unable to distinguish among such combinations.

Therefore, there is a need for a method or apparatus that can correctly and accurately diagnose current sensors' polarities and phase associations in different wiring configurations.

SUMMARY

These needs and others are met by embodiments of the disclosed concept in which sensed three-phase voltages and sensed three-phase currents of a three-phase electric power system are converted to corresponding digital values, at least two phase angles between voltage and current are calculated from the corresponding digital values for at least two of three phases of the three-phase electric power system, polarities and phase associations are diagnosed for at least two current sensors based on, for each of the at least two current sensors, a predetermined wiring configuration of the three-phase electric power system and a corresponding one of the at least two phase angles being within a corresponding predetermined angular range, and corresponding diagnosis results are output.

In accordance with one aspect of the disclosed concept, a system for a three-phase electric power system comprises: a plurality of voltage sensors structured to sense three-phase voltages of the three-phase electric power system; a plurality of current sensors structured to sense three-phase currents of the three-phase electric power system; a number of analog-to-digital converters structured to convert the sensed three-phase voltages and the sensed three-phase currents of the three-phase electric power system to corresponding digital values; and a processor structured to calculate from the corresponding digital values at least two phase angles between voltage and current for at least two of three phases of the three-phase electric power system, diagnose polarities and phase associations for at least two of the current sensors based on, for each of the at least two current sensors, a predetermined wiring configuration of the three-phase electric power system and a corresponding one of the at least two phase angles being within a corresponding predetermined angular range, and output corresponding diagnosis results.

In accordance with another aspect of the disclosed concept, a method for a three-phase electric power system comprises: sensing three-phase voltages of the three-phase electric power system; employing current sensors and sensing three-phase currents of the three-phase electric power system; converting the sensed three-phase voltages and the sensed three-phase currents of the three-phase electric power system to corresponding digital values; calculating from the corresponding digital values at least two phase angles between voltage and current for at least two of three phases of the three-phase electric power system; and diagnosing with a processor polarities and phase associations for at least two of the current sensors based on, for each of the at least two current sensors, a predetermined wiring configuration of the three-phase electric power system and a corresponding one of the at least two phase angles being within a corresponding predetermined angular range, and outputting corresponding diagnosis results.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a digital signal processor; a microprocessor; a microcontroller; a microcomputer; a central processing unit; a controller; a mainframe computer; a minicomputer; a server; a networked processor; or any suitable processing device or apparatus.

The disclosed concept provides a method and apparatus that diagnoses current sensor polarities and phase associations in different wiring configurations for protective relays or electric power or energy meters in three-phase electric power systems. This monitors phase angles between voltage and current waveforms, and diagnoses current sensors' polarity and phase associations in different wiring configurations using the monitored phase angles. Voltages and currents are measured via voltage and current sensors, respectively, and the measured voltages and currents are converted into respective discrete-time voltage and current samples by analog-to-digital converters. A phase angle is calculated between the voltage and current for each phase, and the current sensors' polarities and phase associations under different wiring configurations are diagnosed based on the phase angle. The diagnosis results are output to indicate the current sensors' polarities and phase associations. The diagnosis results may be stored and may be used for troubleshooting or other diagnostic purposes.

Figure 1:
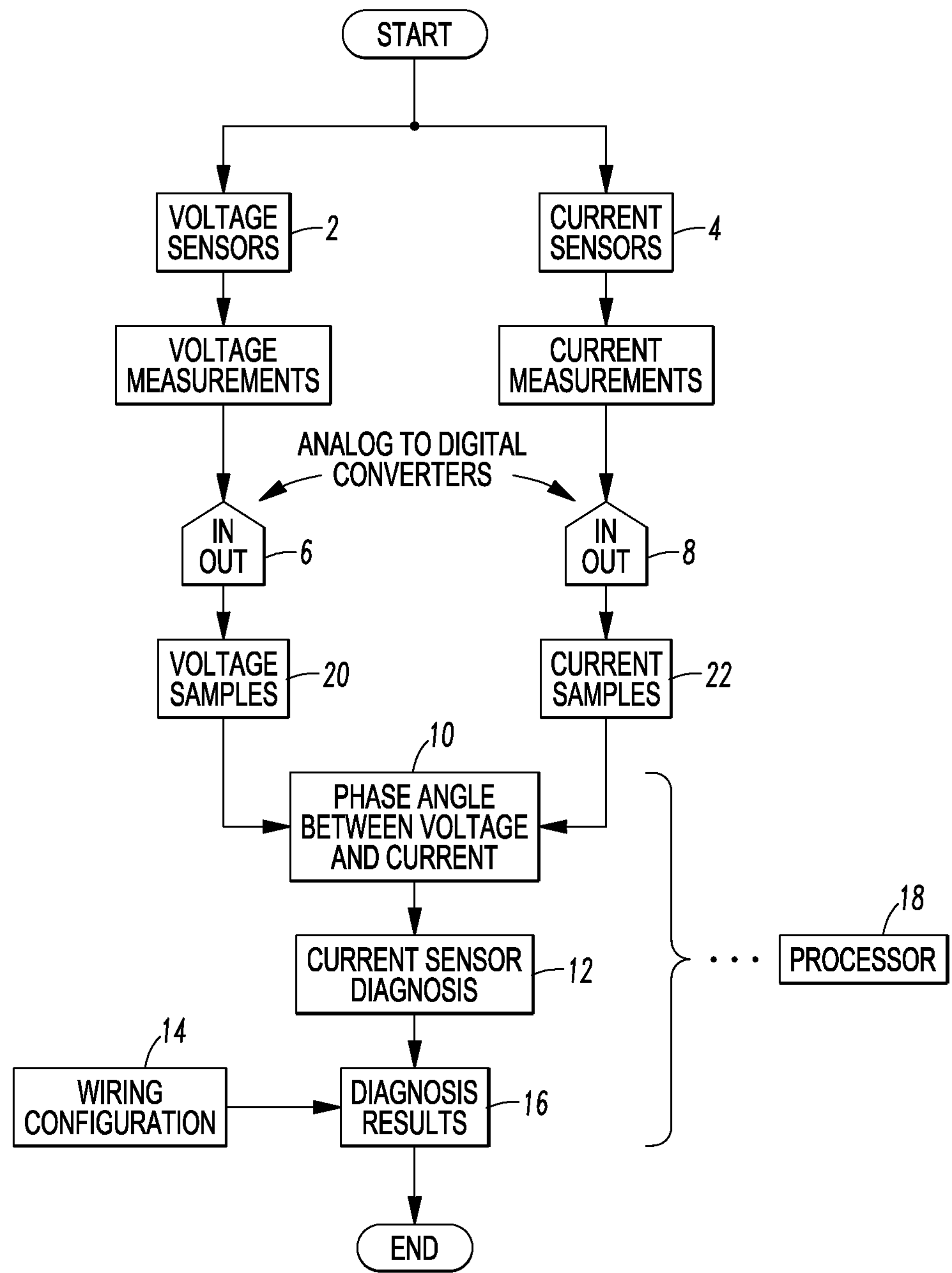
FIG. 1 is a block diagram in schematic form of an architecture of a method and apparatus of current sensor diagnosis in accordance with embodiments of the disclosed concept.

FIG. 1 shows an overall architecture of a method and apparatus of current sensor diagnosis, which includes five parts or stages: (1) voltage and current measurements 3 and 5 are sensed by voltage sensors 2 and current sensors 4, respectively; (2) the voltage and current measurements 3,5 are converted to respective voltage and current samples by analog-to-digital converters (ADCs) 6,8; (3) a phase angle 10 between the voltage and current is typically calculated for phases A, B and C; (4) current sensors' polarities and phase associations are diagnosed 12 based on predetermined wiring configurations 14; and (5) diagnosis results 16 are output, and may be stored and may be used for troubleshooting or other diagnostic purposes. A suitable processor 18 is employed for the last three parts or stages 10,12,16. Although two ADCs 6,8 are shown, a single ADC can be employed having a plurality of channels for outputting digital samples of the sensed voltages and currents. The processor 18 can be part of an electric power meter, an electric energy meter or a protective relay of the three-phase electric power system. The processor 18 can include an example display 19 for the output of the diagnosis results 16.

The voltage and current sensors 2,4 are operable to measure voltage and current waveforms, respectively. The voltage measurements 3 are typically acquired by voltage sensors 2 either from a phase with respect to a separate phase, or from a phase with respect to a voltage reference point. The current measurements 5 are typically acquired by current sensors 4 from all three phases.

Analog-to-digital converters 6,8 are typically used to convert voltage and current measurements 3,5 to discrete-time voltage samples 20 and current samples 22, respectively, at a suitable sampling frequency $f_S$. The sampling frequency $f_S$ is typically expressed in hertz (Hz) or samples per cycle. For example and without limitation, given a three-phase electric power system with a utility frequency of $f_e$=60 Hz, a sampling frequency of 512 samples per cycle is equivalent to a sampling frequency of 30.720 kHz.

For each phase, such as phase A, B, or C, the phase angle 10 between voltage and current is typically calculated by counting the number of samples $N_Z$ from the voltage sample's zero-crossing time to the current sample's zero-crossing time. Because the sampling frequency $f_S$ (in hertz) is a known quantity, the number of samples from the voltage sample's zero-crossing time to the current sample's zero-crossing time may be converted to a time quantity $T_Z$ (in seconds) via Equation 1:

$$T_Z=N_Z/f_S \quad \text{(Eq. 1)}$$

Because the utility frequency $f_e$ (in hertz) of the three-phase electric power system is typically a known quantity, the time quantity $T_Z$ is further converted to a phase angle (φ) between voltage and current, and is typically expressed in degrees (°) via Equation 2:

$$\varphi=\text{rem}(360\cdot T_Z\cdot f_e,360) \quad \text{(Eq. 2)}$$

wherein:

rem(·, 360) denotes the remainder of a quantity after it is divided by 360; this operation wraps the phase angle between voltage and current to a non-negative value between 0° and 360°, and simplifies the subsequent current sensor diagnosis.

Following the above definition, when the voltage and current waveforms are in phase with each other, the voltage and current samples' zero-crossing times are identical. Consequently, the phase angle between voltage and current is 0°. Otherwise, the phase angle between voltage and current is a positive value less than 360°.

The current sensor diagnosis 12 determines whether a current sensor has been configured with a correct polarity and associated with a correct phase. The current sensor diagnosis 12 first obtains wiring configuration information 14, and then uses the phase angle 10 between voltage and current to determine the current sensor's configuration.

When real power P (in watts), reactive power Q (in vars) and apparent power S (in volt-amperes) of each phase are available, an alternative method to calculate the phase angle between voltage and current for each phase is to calculate an intermediate phase angle φ' using Table I.

TABLE I

| P | Q | φ' |
|---|---|---|
| >0 | >0 | arctan(Q'/P') |
| <0 | >0 | arctan(Q'/P') + π |
| <0 | <0 | arctan(Q'/P') − π |
| >0 | <0 | arctan(Q'/P') |
| =0 | >0 | π/2 |
| =0 | <0 | −π/2 |
| =0 | =0 | undefined |

In Table I, arctan(·) is an arctangent function whose range is between −π/2 and π/2 exclusive, i.e., $-\pi/2<\arctan(\cdot)<\pi/2$. For example, if P<0 and Q<0, then $\varphi'=\arctan(Q'/P')-\pi$, where P'=P/S and Q'=Q/S are used to avoid arithmetic overflow.

The phase angle between voltage and current is obtained from the intermediate phase angle φ' via: $\varphi=\mathrm{rem}[(\varphi'+2\pi)\cdot 180/\pi, 360]$.

Figure 3:
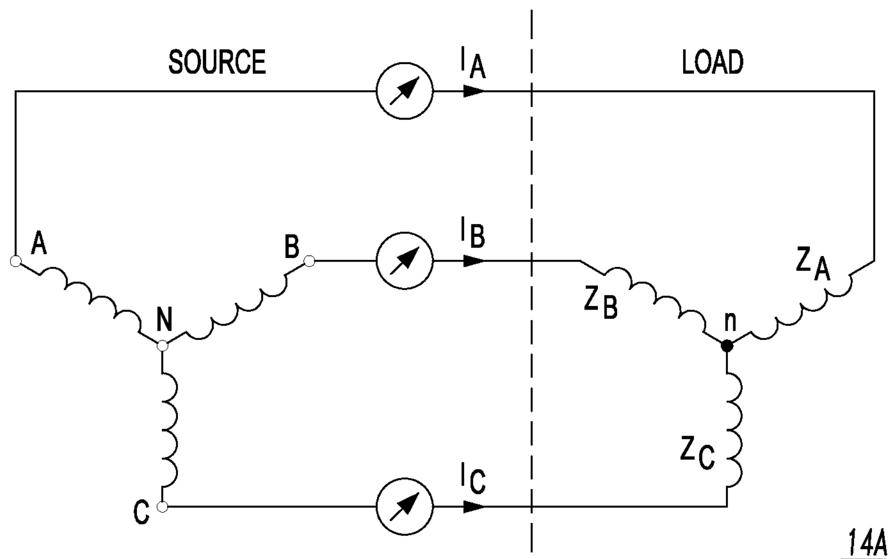
FIG. 3 is a circuit diagram of an example 3-phase 4-wire wye wiring configuration for use with the method and apparatus of FIG. 1.
Figure 6:
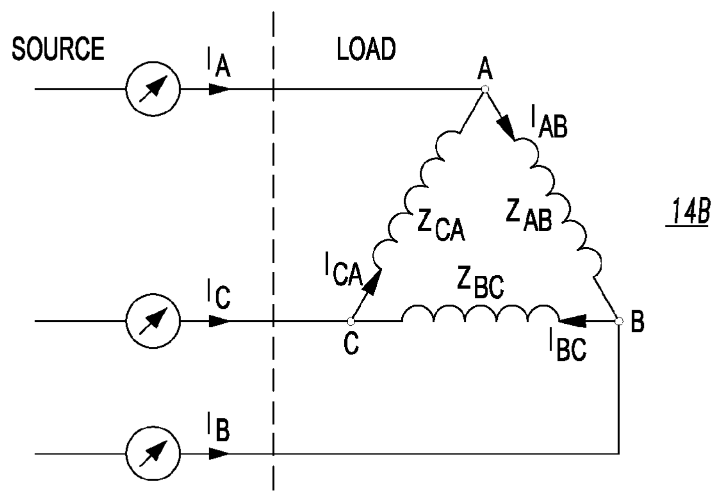
FIG. 6 is a circuit diagram of an example 3-phase 3-wire delta wiring configuration for use with the method and apparatus of FIG. 1.
Figure 8:
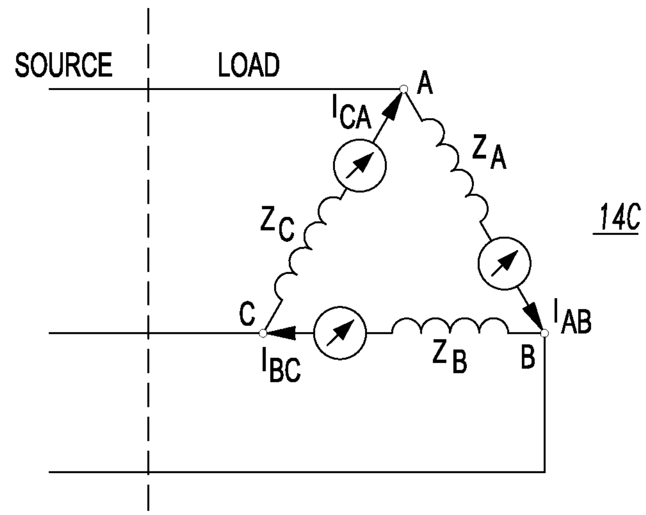
FIG. 8 is a circuit diagram of an example 3-phase 3-wire inside delta wiring configuration for use with the method and apparatus of FIG. 1.
Figure 13:
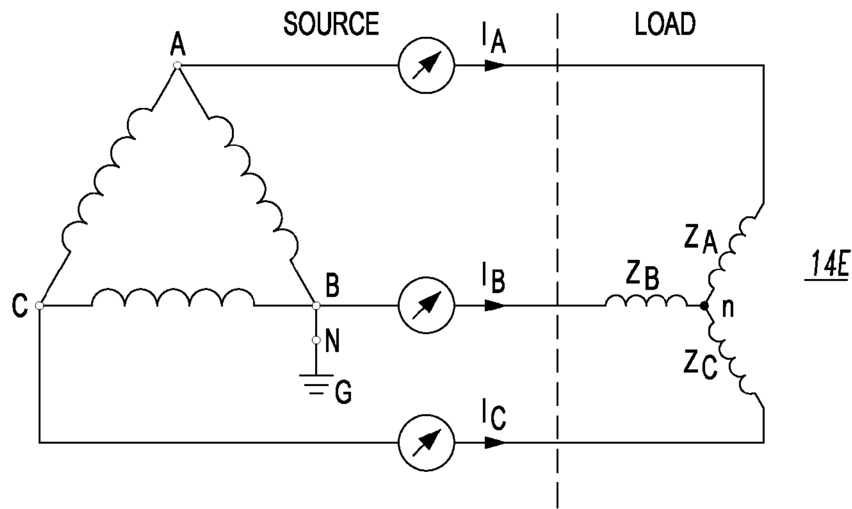
FIG. 13 is a circuit diagram of a 3-phase corner-grounded delta wiring configuration for use with the method and apparatus of FIG. 1.

For electric power or energy meters used in three-phase electric power systems, the wiring configuration is typically one of the following possible cases: (1) 3-Phase 4-Wire Wye (FIG. 3); (2) 3-Phase 3-Wire Delta (FIG. 6); (3) 3-Phase 3-Wire Inside Delta (FIG. 8); (4) 3-Phase 4-Wire Delta (FIG. 10); and (5) 3-Phase Corner-Grounded Delta (FIG. 13).

For a current sensor intended to measure phase A current in a 3-phase 4-wire wye wiring configuration (FIG. 3), there are six possible scenarios for this particular current sensor: (1) the current sensor 4 (FIG. 1) is wired to the phase A current-carrying conductor with a normal polarity, consequently, the current measurement 5 from the current sensor is $I_A$; (2) the current sensor 4 is wired to the phase A current-carrying conductor with a reversed polarity, consequently, the current measurement 5 from the current sensor is $-I_A$; (3) the current sensor 4 is wired to the phase B current-carrying conductor with a normal polarity, consequently, the current measurement 5 from the current sensor is $I_B$; (4) the current sensor 4 is wired to the phase B current-carrying conductor with a reversed polarity, consequently, the current measurement 5 from the current sensor is $-I_B$; (5) the current sensor 4 is wired to the phase C current-carrying conductor with a normal polarity, consequently, the current measurement 5 from the current sensor is $I_C$; and (6) the current sensor 4 is wired to the phase C current-carrying conductor with a reversed polarity, consequently, the current measurement 5 from the current sensor is $-I_C$.

Similarly, a current sensor intended to measure phase B or C current also has six possible scenarios in each case. The current sensor diagnosis 12 determines which scenario a particular current sensor has by analyzing the phase angle 10 between voltage and current.

For four of the five wiring configurations: (1) 3-Phase 4-Wire Wye (FIG. 3); (2) 3-Phase 3-Wire Delta (FIG. 6); (3) 3-Phase 4-Wire Delta (FIG. 10); and (4) 3-Phase Corner-Grounded Delta (FIG. 13), the normal polarity is defined as being from a source to a connected load, and the reversed polarity is defined as being from a load to a connected source.

For the 3-Phase 3-Wire Inside Delta (FIG. 8) wiring configuration, the normal polarity of a current sensor intended to measure current from node "A" to node "B" is defined as being from node "A" pointing toward node "B." Likewise, similar definitions apply to the normal polarity of a current sensor intended to measure current from node "B" to node "C," and the normal polarity of a current sensor intended to measure current from node "C" to node "A," respectively. The reversed polarity of a current sensor intended to measure current from node "A" to node "B" is defined as being from node "B" pointing toward node "A." Likewise, similar definitions apply to the reversed polarities of other current sensors in this wiring configuration.

All voltage sensors 2 are assumed to have been correctly configured in polarities and phase associations. For instance, in the example 3-phase 4-wire wye wiring configuration (FIG. 3), above, a voltage sensor 2 intended for voltage measurement $V_{AN}$ is configured correctly to measure voltage from phase A to neutral N. A second voltage sensor 2 intended for voltage measurement $V_{BN}$ is configured correctly to measure voltage from phase B to neutral N. A third voltage sensor 2 intended for voltage measurement $V_{CN}$ is configured correctly to measure voltage from phase C to neutral N.

In addition, because most modern three-phase electric power systems are regulated, three-phase voltages are, hence, assumed to be balanced, i.e., the voltage measurements $V_{AN}$, $V_{BN}$, $V_{CN}$, when expressed in phasors, have the same amplitude, and are 120° degrees apart from each other.

Voltage measurements $V_{AB}$, $V_{BC}$, $V_{CA}$, are related to voltage measurements $V_{AN}$, $V_{BN}$, $V_{CN}$ via Equations 3-5, respectively:

$$V_{AB}=V_{AN}-V_{BN} \quad \text{(Eq. 3)}$$

$$V_{BC}=V_{BN}-V_{CN} \quad \text{(Eq. 4)}$$

$$V_{CA}=V_{CN}-V_{AN} \quad \text{(Eq. 5)}$$

Figure 2:
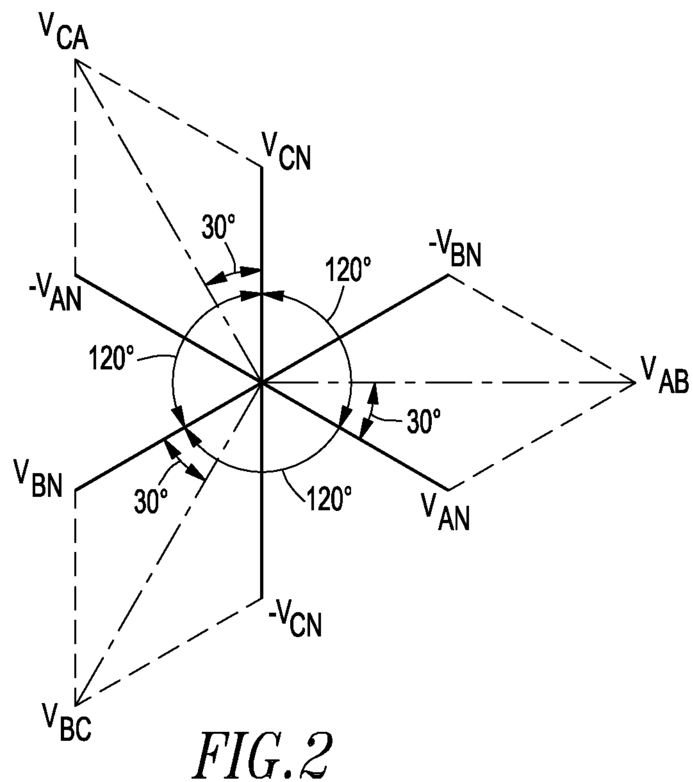
FIG. 2 is a phasor diagram of $V_{AN}$, $V_{BN}$, $V_{CN}$ and $V_{AB}$, $V_{BC}$, $V_{CA}$ in a three-phase power system with balanced three-phase voltages in connection with the method and apparatus of FIG. 1.

Consequently, voltage measurements $V_{AB}$, $V_{BC}$, $V_{CA}$, when expressed in phasors, all have the same amplitude, and are 120° degrees apart from each other, as shown in FIG. 2.

The disclosed concept assumes a three-phase symmetric load (Z) per Equation 6:

$$Z_A=Z_B=Z_C=Z \quad \text{(Eq. 6)}$$

wherein:

$Z_A$, $Z_B$ and $Z_C$ are symmetrical loads (see, for example, FIG. 3) for each of the respective phases A, B and C.

Also, the load impedance phase angle, φ, is limited, for example, to between 10° leading (a capacitive load) and 50° lagging (an inductive load). If the load impedance phase angle, $\varphi$, is expressed as a non-negative value between 0° and 360°, then the above limit translates to $0° \leq \varphi < 50°$ and $350° < \varphi < 360°$.

The above load impedance phase angle range includes: (1) purely resistive loads, in which the load impedance phase angle is $\varphi = 0°$; (2) a major portion of inductive loads, including induction motors, in which the load impedance has a lagging phase angle, i.e., $0° < \varphi < 50°$; and (3) certain capacitive loads, in which the load impedance has a leading phase angle, i.e., $350° < \varphi < 360°$.

While the above assumption limits the load impedance phase angle $\varphi$ to a range $0° \leq \varphi < 50°$ and $350° < \varphi < 360°$, other load impedance phase angle ranges can alternatively be used. For example, in a system predominated by inductive loads, the load impedance phase angle $\varphi$ may alternatively be assumed to range from 20° lagging (an inductive load) to 80° lagging (an inductive load), i.e., $20° < \varphi < 80°$.

For each of the five example wiring configurations 14, the corresponding current sensor diagnosis 12 has a different set of rules. The rules are formulated below, and a table summarizes the set of rules for each particular example wiring configuration 14.

FIG. 3 shows an example 3-phase 4-wire wye wiring configuration 14A. In practice, the neutral N is connected to ground G (not shown) through at least a resistor (not shown) with a suitably high resistance to suppress overvoltages caused by re-striking arcs.

The positive direction of the phase A current measurement $I_A$ is defined as being from node "A" to node "n", and the voltage $V_{An}$ is defined as the voltage at node "A" with respect to the voltage at node "n". Likewise, similar definitions apply to phase B and phase C quantities $I_B$, $I_C$, and $V_{Bn}$, $V_{Cn}$.

According to the example load impedance phase angle assumption, above, the example load impedance phase angle is between 10° leading and 50° lagging. Therefore, the phase angle between voltage $V_{An}$ and current measurement $I_A$ ranges from 10° leading to 50° lagging. Likewise, the phase angle between voltage $V_{Bn}$ and current measurement $I_B$ ranges from 10° leading to 50° lagging, and the phase angle between voltage $V_{Cn}$ and current measurement $I_C$ ranges from 10° leading to 50° lagging.

Figure 4A:
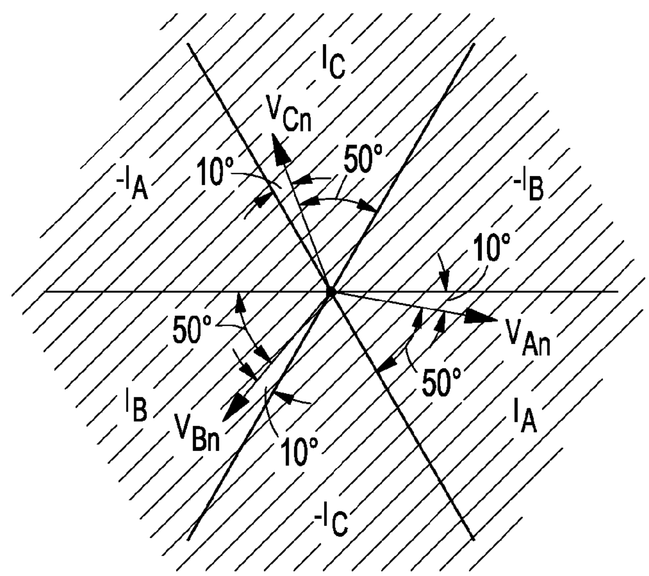
FIGS. 4A and 4B are phasor diagrams showing the relationship between voltages $V_{An}$, $V_{Bn}$, $V_{Cn}$ and current measurements $I_A$, $I_B$, $I_C$, and the relationship between voltage measurements $V_{AN}$, $V_{BN}$, $V_{CN}$ and current measurements $I_A$, $I_B$, $I_C$, respectively, in accordance with an embodiment of the disclosed concept.

FIG. 4A shows relationships between voltages $V_{An}$, $V_{Bn}$, $V_{Cn}$, and current measurements $I_A$, $I_B$, $I_C$. The shaded areas indicate angular ranges of current measurements with respect to voltages. For example, for a current sensor 4 (FIG. 1) intended to measure phase A current, if the current measurement 5 falls into the shaded area of FIG. 4A that covers voltage $V_{An}$ on the lower-right (with respect to FIG. 4A) section from the 3 o'clock position to the 5 o'clock position, then the current sensor is correctly associated with the phase A current-carrying conductor, and has a normal polarity as intended. Otherwise, the current sensor 4 is mistakenly associated with a current-carrying conductor other than the phase A conductor, or may have an incorrect polarity.

In practice, the node "N" of FIG. 3 is accessible, while the node "n" of FIG. 3 is not always provided for access. For example, when a three-phase induction motor (not shown) is connected as a load of FIG. 3, the node "n" is internal to the motor, and cannot be easily accessed. Consequently, voltage measurements $V_{AN}$, $V_{BN}$, $V_{CN}$, and current measurements $I_A$, $I_B$, $I_C$ are available, while voltages $V_{An}$, $V_{Bn}$, $V_{Cn}$ are typically not available. In this case, the phase angle between $V_{AN}$ and $I_A$ can be obtained, while the phase angle between $V_{An}$ and $I_A$ typically cannot be obtained.

The following discloses steps to diagnose current sensors for the 3-phase 4-wire wye wiring configuration 14A using the phase angles between voltage measurements $V_{AN}$, $V_{BN}$, $V_{CN}$ and current measurements $I_A$, $I_B$, $I_C$, respectively.

For balanced three-phase voltages, the sum of $V_{AN}$, $V_{BN}$, and $V_{CN}$ is 0 in Equation 7:

$$V_{AN}+V_{BN}+V_{CN}=0 \quad \text{(Eq. 7)}$$

Kirchhoff's current law dictates that the sum of current measurements at node "n" is 0 as in Equation 8:

$$I_A+I_B+I_C=0 \quad \text{(Eq. 8)}$$

According to FIG. 3, Equation 9 provides:

$$I_A=V_{An}/Z_A, I_B=V_{Bn}/Z_B, I_C=V_{Cn}/Z_C \quad \text{(Eq. 9)}$$

Substituting Equation 9 into Equation 8 yields Equation 10:

$$V_{An}/Z_A+V_{Bn}/Z_B+V_{Cn}/Z_C=0 \quad \text{(Eq. 10)}$$

Equation 10 can be further simplified to Equation 11 using the symmetric load assumption in Equation 6:

$$V_{An}+V_{Bn}+V_{Cn}=0 \quad \text{(Eq. 11)}$$

Subtracting Equation 11 from Equation 7 yields Equation 12:

$$(V_{AN}-V_{An})+(V_{BN}-V_{Bn})+(V_{CN}-V_{Cn})=3V_{Nn}=0 \quad \text{(Eq. 12)}$$

From Equation 12, $V_{Nn}=0$. Therefore, $V_{AN}=V_{An}$, $V_{BN}=V_{Bn}$, and $V_{CN}=V_{Cn}$. The resulting voltage measurements $V_{AN}$, $V_{BN}$, and $V_{CN}$, when expressed in phasors, are shown in FIG. 5.

Figure 4B:
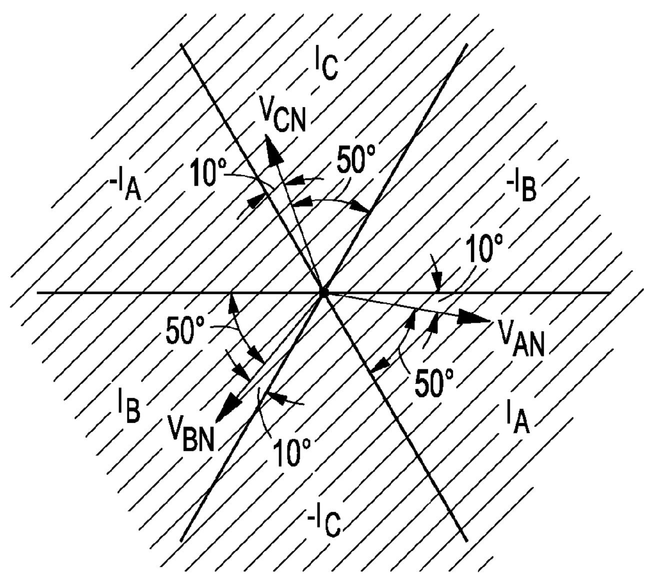
Figure 5:
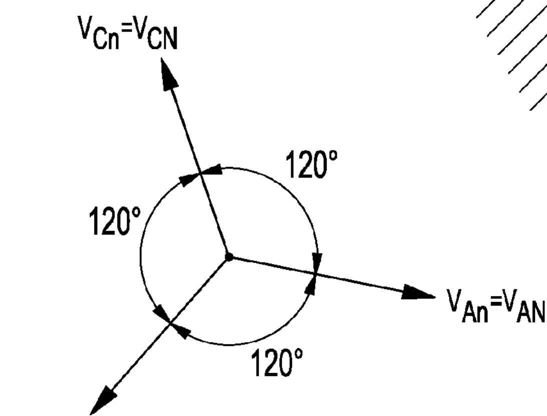
FIG. 5 is a phasor diagram of voltages $V_{An}$, $V_{Bn}$, $V_{Cn}$ and voltage measurements $V_{AN}$, $V_{BN}$, $V_{CN}$ of FIGS. 4A and 4B.

Combining FIGS. 4A and 5 yields FIG. 4B, which shows relationships between the voltage measurements $V_{AN}$, $V_{BN}$, $V_{CN}$, and the current measurements $I_A$, $I_B$, $I_C$. The shaded areas in FIG. 4B indicate angular ranges of current measurements with respect to voltage measurements. For example, for a current sensor 4 (FIG. 1) intended to measure phase A current, if the current measurement 5 falls into the shaded area that covers voltage measurement $V_{AN}$ on the lower-right (with respect to FIG. 4B) section from the 3 o'clock position to the 5 o'clock position, then the current sensor 4 is correctly associated with the phase A current-carrying conductor, and has a normal polarity as intended.

Following the definition in Equation 2, the phase angle 10 (FIG. 1) between the voltage measurement $V_{AN}$ and the current measurement $I_A$, denoted as $\varphi_A$, starts as 0° at $V_{AN}$, and increases up to 360° clockwise in FIG. 4B. As a result, in the above example, the phase angle $\varphi_A$ has the following relationship: $0° \leq \varphi_A < 50°$ or $350° < \varphi_A < 360°$ when the current sensor 4 intended to measure the phase A current is correctly associated with the phase A current-carrying conductor, and has a normal polarity as intended.

Likewise, for a current sensor 4 intended to measure the phase B current, the phase angle between the voltage measurement $V_{BN}$ and the current measurement $I_B$, denoted as $\varphi_B$, starts as 0° at $V_{BN}$ when the definition in Equation 2 is used. If the sensor's current measurement falls into the shaded area that covers the upper-left (with respect to FIG. 4B) section from the 9 o'clock position to the 11 o'clock position, then $50° < \varphi_B < 110°$. In this case, the current sensor 4 is mistakenly associated with the phase A current-carrying conductor, and at the same time has a reversed polarity $-I_A$ instead of $I_B$. Based on the above observation, the current sensor diagnosis determines that the current sensor has an incorrect configuration that is contrary to its intended use.

Table II summarizes cases from FIG. 4B, and shows the current sensor diagnosis for the 3-phase 4-wire wye wiring configuration 14A. If a current sensor 4 is intended to measure a particular phase current, then the phase angle between the voltage measurement 3 of that particular phase and the current measurement 5 from the current sensor 4 is used. The current sensor diagnosis 12 determines the current sensor's polarity and phase association by reading appropriate entries in Table II.

For example, for a current sensor 4 intended to measure the phase C current, if $0° \le \varphi_C < 50°$ or $350° < \varphi_C < 360°$, the current sensor diagnosis 12 reads the corresponding entry from Table II, and determines that the current sensor is correctly associated with the phase C current-carrying conductor, and has a normal polarity as intended. However, if $50° < \varphi_C < 110°$, then based on the corresponding entry in Table II, the current sensor diagnosis determines that the current sensor is incorrectly associated with the phase B current carrying conductor, and at the same time has a reversed polarity, which is contrary to the current sensor's intended use.

TABLE II

| $\varphi_A$ | | $\varphi_B$ | | $\varphi_C$ | |
|---|---|---|---|---|---|
| $0° \le \varphi_A < 50°$ or $350° < \varphi_A < 360°$ | $I_A$ | $0° \le \varphi_B < 50°$ or $350° < \varphi_B < 360°$ | $I_B$ | $0° \le \varphi_C < 50°$ or $350° < \varphi_C < 360°$ | $I_C$ |
| $50° < \varphi_A < 110°$ | $-I_C$ | $50° < \varphi_B < 110°$ | $-I_A$ | $50° < \varphi_C < 110°$ | $-I_B$ |
| $110° < \varphi_A < 170°$ | $I_B$ | $110° < \varphi_B < 170°$ | $I_C$ | $110° < \varphi_C < 170°$ | $I_A$ |
| $170° < \varphi_A < 230°$ | $-I_A$ | $170° < \varphi_B < 230°$ | $-I_B$ | $170° < \varphi_C < 230°$ | $-I_C$ |
| $230° < \varphi_A < 290°$ | $I_C$ | $230° < \varphi_B < 290°$ | $I_A$ | $230° < \varphi_C < 290°$ | $I_B$ |
| $290° < \varphi_A < 350°$ | $-I_B$ | $290° < \varphi_B < 350°$ | $-I_C$ | $290° < \varphi_C < 350°$ | $-I_A$ |

FIG. 6 shows an example 3-phase 3-wire delta wiring configuration 14B. The voltage $V_{AB}$ is defined as the voltage at node "A" with respect to the voltage at node "B," and the current $I_{AB}$ is defined as the current flowing from node "A" to node "B." Likewise, similar definitions apply to voltages $V_{BC}$, $V_{CA}$, and currents $I_{BC}$, $I_{CA}$.

According to the load impedance phase angle assumption, the example phase angle between the voltage $V_{AB}$ and the current $I_{AB}$ is between 10° leading and 50° lagging. Likewise, the phase angle between $V_{BC}$ and $I_{BC}$ is between 10° leading and 50° lagging, and the phase angle between $V_{CA}$ and $I_{CA}$ is between 10° leading and 50° lagging.

Figure 7A:
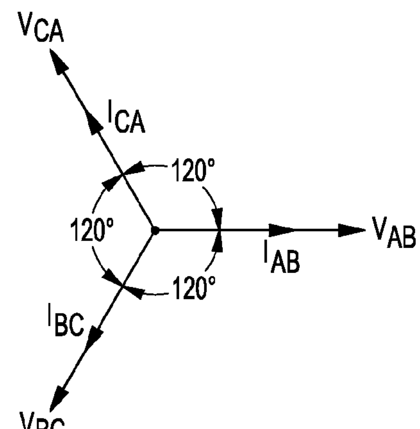
FIGS. 7A and 7B are phasor diagrams showing the relationship between voltages $V_{AB}$, $V_{BC}$, $V_{CA}$ and currents $I_{AB}$, $I_{BC}$, $I_{CA}$ when three-phase purely resistive loads are considered, and the relationship between currents $I_{AB}$, $I_{BC}$, $I_{CA}$ and current measurements $I_A$, $I_B$, $I_C$, respectively, in accordance with another embodiment of the disclosed concept.
Figure 7B:
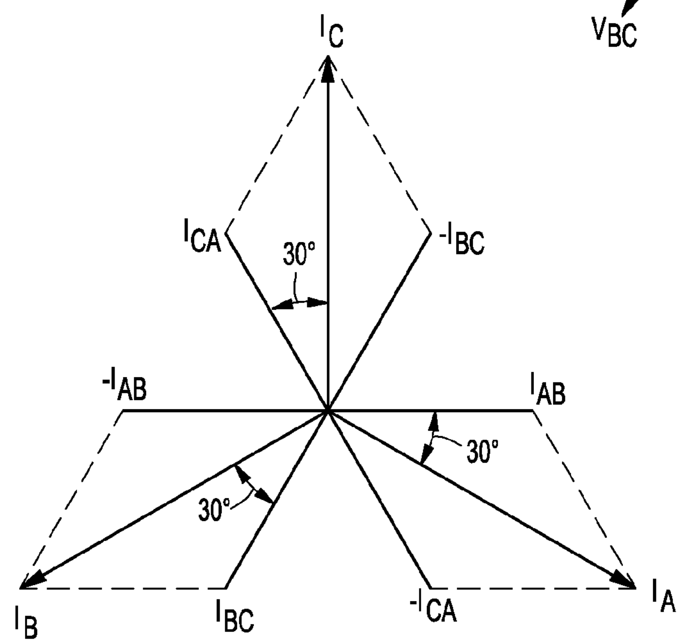

FIG. 7A shows the relationship between the voltages $V_{AB}$, $V_{BC}$, $V_{CA}$ and the currents $I_{AB}$, $I_{BC}$, $I_{CA}$ when three-phase purely resistive loads are considered. FIG. 7B shows the relationship between currents $I_{AB}$, $I_{BC}$, $I_{CA}$ and current measurements $I_A$, $I_B$, $I_C$.

In practice, voltage measurements $V_{AN}$, $V_{BN}$, $V_{CN}$, and current measurements $I_A$, $I_B$, $I_C$ are available. Consequently, the phase angles between voltage measurement $V_{AN}$ and current measurement $I_A$, $V_{BN}$ and $I_B$, $V_{CN}$ and $I_C$, are available. To perform the current sensor diagnosis 12, the relationships between voltage measurements $V_{AN}$, $V_{BN}$, $V_{CN}$ and voltages $V_{AB}$, $V_{BC}$, $V_{CA}$ are first established. The relationships between current measurements $I_A$, $I_B$, $I_C$ and currents $I_{AB}$, $I_{BC}$, $I_{CA}$ are then formulated, and the relationships between voltage measurements $V_{AN}$, $V_{BN}$, $V_{CN}$ and current measurements $I_A$, $I_B$, $I_C$ are disclosed.

Given balanced three-phase voltages, the relationships between voltage measurements $V_{AN}$, $V_{BN}$, $V_{CN}$ and voltages $V_{AB}$, $V_{BC}$, $V_{CA}$, when expressed in phasors, are shown in FIG. 2. $V_{AN}$ lags behind $V_{AB}$ by 30°, $V_{BN}$ lags behind $V_{BC}$ by 30°, and $V_{CN}$ lags behind $V_{CA}$ by 30°.

Given balanced three-phase voltages and balanced three-phase loads, the currents $I_{AB}$, $I_{BC}$, $I_{CA}$ of FIG. 7B are also balanced: $I_{AB}$ leads $I_{BC}$ by 120°, $I_{BC}$ leads $I_{CA}$ by 120°, and $I_{CA}$ leads $I_{AB}$ by 120°. FIG. 6 further has the following relationships of Equations 13-15:

$$I_A = I_{AB} - I_{CA} \quad \text{(Eq. 13)}$$

$$I_B = I_{BC} - I_{AB} \quad \text{(Eq. 14)}$$

$$I_C = I_{CA} - I_{BC} \quad \text{(Eq. 15)}$$

Based on Equations 13-15, FIG. 7B shows the relationships between current measurements $I_A$, $I_B$, $I_C$, and currents $I_{AB}$, $I_{BC}$, $I_{CA}$. $I_A$ lags behind $I_{AB}$ by 30°, $I_B$ lags behind $I_{BC}$ by 30°, and $I_C$ lags behind $I_{CA}$ by 30°.

As shown in FIG. 7A, the voltage $V_{AB}$ is in phase with the current $I_{AB}$ when three-phase purely resistive loads are considered. Because the voltage measurement $V_{AN}$ lags behind the voltage $V_{AB}$ by 30°, and the current measurement $I_A$ lags behind the current $I_{AB}$ by 30°, as given in FIGS. 2 and 7B, respectively, the voltage measurement $V_{AN}$ is in phase with the current measurement $I_A$, i.e., the phase angle between $V_{AN}$ and $I_A$ is 0°, when three-phase purely resistive loads are considered.

Because the phase angle between the voltage $V_{AB}$ and the current $I_{AB}$ can vary, for example, from 10° leading to 50° lagging, the phase angle between the voltage measurement $V_{AN}$ and the current measurement $I_A$ can also vary from 10° leading to 50° lagging. Likewise, the phase angle between $V_{BN}$ and the $I_B$ ranges from 10° leading to 50° lagging, and the phase angle between $V_{CN}$ and the $I_C$ ranges from 10° to 50° lagging.

Table III, which is the same as Table II and is repeated below for convenience of reference for this example, summarizes all possible cases, and shows the current sensor diagnosis 12 for the 3-phase 3-wire delta wiring configuration 14B. $\varphi_A$ denotes the phase angle between the voltage measurement $V_{AN}$ and the current measurement 5 from a current sensor 4 intended to measure phase A current, $\varphi_B$ denotes the phase angle between the voltage measurement $V_{BN}$ and the current measurement 5 from a current sensor 4 intended to measure phase B current, and $\varphi_C$ denotes the phase angle between the voltage measurement $V_{CN}$ and the current measurement 5 from a current sensor 4 intended to measure phase C current.

TABLE III

| $\varphi_A$ | | $\varphi_B$ | | $\varphi_C$ | |
|---|---|---|---|---|---|
| $0° \le \varphi_A < 50°$ or $350° < \varphi_A < 360°$ | $I_A$ | $0° \le \varphi_B < 50°$ or $350° < \varphi_B < 360°$ | $I_B$ | $0° \le \varphi_C < 50°$ or $350° < \varphi_C < 360°$ | $I_C$ |

TABLE III-continued

| $\varphi_A$ | | $\varphi_B$ | | $\varphi_C$ | |
|---|---|---|---|---|---|
| $50° < \varphi_A < 110°$ | $-I_C$ | $50° < \varphi_B < 110°$ | $-I_A$ | $50° < \varphi_C < 110°$ | $-I_B$ |
| $110° < \varphi_A < 170°$ | $I_B$ | $110° < \varphi_B < 170°$ | $I_C$ | $110° < \varphi_C < 170°$ | $I_A$ |
| $170° < \varphi_A < 230°$ | $-I_A$ | $170° < \varphi_B < 230°$ | $-I_B$ | $170° < \varphi_C < 230°$ | $-I_C$ |
| $230° < \varphi_A < 290°$ | $I_C$ | $230° < \varphi_B < 290°$ | $I_A$ | $230° < \varphi_C < 290°$ | $I_B$ |
| $290° < \varphi_A < 350°$ | $-I_B$ | $290° < \varphi_B < 350°$ | $-I_C$ | $290° < \varphi_C < 350°$ | $-I_A$ |

FIG. 8 shows an example 3-phase 3-wire inside delta wiring configuration 14C. Unlike other wiring configurations, voltage measurements $V_{AB}$, $V_{BC}$, $V_{CA}$, and current measurements $I_{AB}$, $I_{BC}$, $I_{CA}$ are typically available in 3-phase 3-wire inside delta wiring configurations. The voltage measurement $V_{AB}$ is defined as the voltage at node "A" with respect to the voltage at node "B," and the current measurement $I_{AB}$ is defined as the current flowing from node "A" to node "B." Likewise, similar definitions apply to voltage measurements $V_{BC}$, $V_{CA}$, and current measurements $I_{BC}$, $I_{CA}$.

Figure 9:
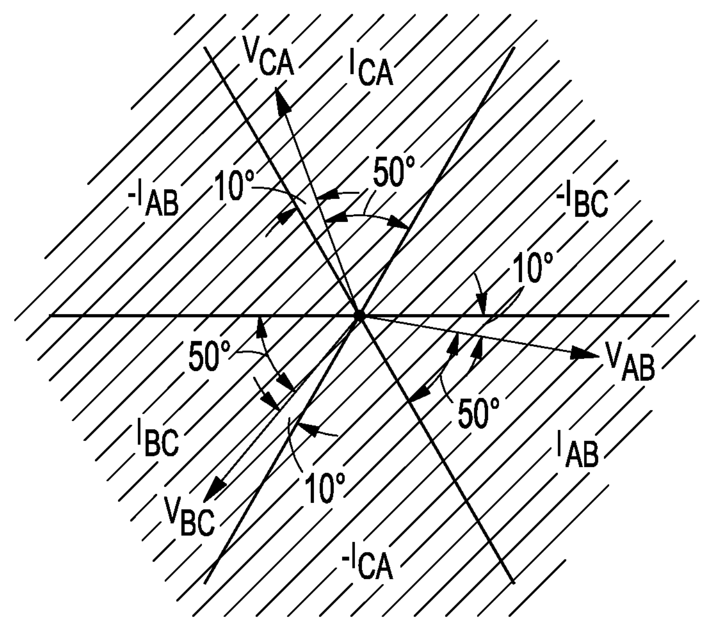
FIG. 9 is a phasor diagram showing the relationship between voltage measurements $V_{AB}$, $V_{BC}$, $V_{CA}$, and current measurements $I_{AB}$, $I_{BC}$, $I_{CA}$ in accordance with another embodiment of the disclosed concept.

According to the load impedance phase angle assumption, the example phase angle between the voltage measurement $V_{AB}$ and the current $I_{AB}$ is between 10° leading and 50° lagging. Likewise, the example phase angle between $V_{BC}$ and $I_{BC}$ is between 10° leading and 50° lagging, and the example phase angle between $V_{CA}$ and $I_{CA}$ is between 10° leading and 50° lagging. FIG. 9 shows the relationship between voltage measurements $V_{AB}$, $V_{BC}$, $V_{CA}$, and current measurements $I_{AB}$, $I_{BC}$, $I_{CA}$.

Table IV summarizes cases from FIG. 9, and shows the current sensor diagnosis for the 3-phase 3-wire inside delta wiring configuration 14C (FIG. 8). $\varphi_A$ denotes the phase angle between the voltage measurement $V_{AB}$ and the current measurement 5 from a current sensor 4 (FIG. 1) intended to measure current from node "A" to node "B," $\varphi_B$ denotes the phase angle between the voltage measurement $V_{BC}$ and the current measurement 5 from a current sensor 4 intended to measure current from node "B" to node "C," and $\varphi_C$ denotes the phase angle between the voltage measurement $V_{CA}$ and the current measurement 5 from a current sensor 4 intended to measure current from node "C" to node "A."

For example, for a current sensor 4 (FIG. 1) intended to measure current from node "C" to node "A," if $0° \leq \varphi_C < 50°$ or $350° < \varphi_C < 360°$, then the current sensor diagnosis 12 (FIG. 1) reads the corresponding entry from Table IV, and determines that the current sensor 4 is correctly associated with the leg CA current-carrying conductor, and has a normal polarity as intended. However, if $50° < \varphi_C < 110°$, then based on the corresponding entry in Table IV, the current sensor diagnosis 12 determines that the current sensor is incorrectly associated with the leg BC current-carrying conductor, and at the same time has a reversed polarity, which is contrary to the current sensor's intended use.

TABLE IV

| $\varphi_A$ | | $\varphi_B$ | | $\varphi_C$ | |
|---|---|---|---|---|---|
| $0° \leq \varphi_A < 50°$ or $350° < \varphi_A < 360°$ | $I_{AB}$ | $0° \leq \varphi_B < 50°$ or $350° < \varphi_B < 360°$ | $I_{BC}$ | $0° \leq \varphi_C < 50°$ or $350° < \varphi_C < 360°$ | $I_{CA}$ |
| $50° < \varphi_A < 110°$ | $-I_{CA}$ | $50° < \varphi_B < 110°$ | $-I_{AB}$ | $50° < \varphi_C < 110°$ | $-I_{BC}$ |
| $110° < \varphi_A < 170°$ | $I_{BC}$ | $110° < \varphi_B < 170°$ | $I_{CA}$ | $110° < \varphi_C < 170°$ | $I_{AB}$ |
| $170° < \varphi_A < 230°$ | $-I_{AB}$ | $170° < \varphi_B < 230°$ | $-I_{BC}$ | $170° < \varphi_C < 230°$ | $-I_{CA}$ |
| $230° < \varphi_A < 290°$ | $I_{CA}$ | $230° < \varphi_B < 290°$ | $I_{AB}$ | $230° < \varphi_C < 290°$ | $I_{BC}$ |
| $290° < \varphi_A < 350°$ | $-I_{BC}$ | $290° < \varphi_B < 350°$ | $-I_{CA}$ | $290° < \varphi_C < 350°$ | $-I_{AB}$ |

Figure 10:
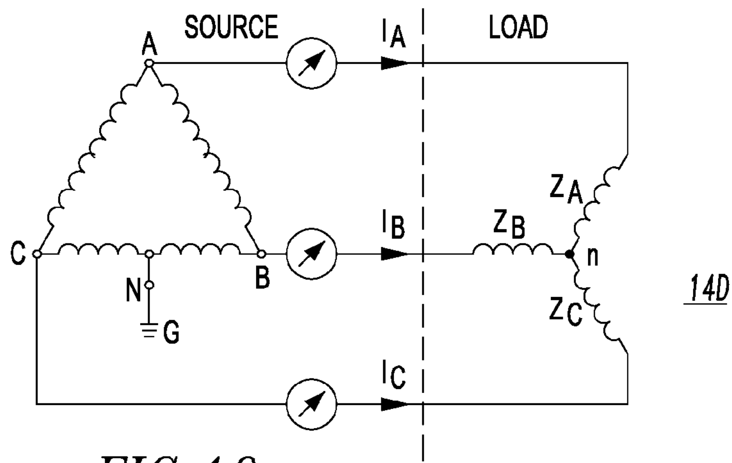
FIG. 10 is a circuit diagram of an example 3-phase 4-wire delta wiring configuration for use with the method and apparatus of FIG. 1.
Figure 11A:
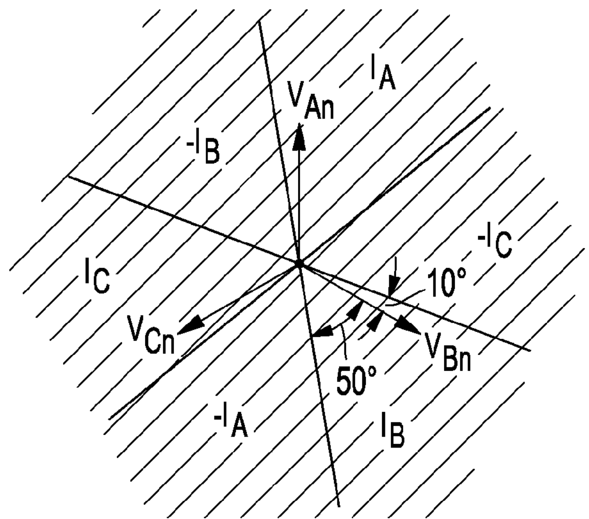
FIGS. 11A and 11B are phasor diagrams showing relationships between voltages $V_{An}$, $V_{Bn}$, $V_{Cn}$ and current measurements $I_A$, $I_B$, $I_C$, and showing relationships between voltage phasors $V_{AN}$, $V_{BN}$, $V_{CN}$ and current phasors $I_A$, $I_B$, $I_C$, respectively, in accordance with another embodiment of the disclosed concept.

FIG. 10 shows an example 3-phase 4-wire delta wiring configuration 14D. This is also known as high-leg delta wiring configuration. According to the load impedance phase angle assumption, FIG. 11A shows the relationships between voltages $V_{An}$, $V_{Bn}$, $V_{Cn}$, and current measurements $I_A$, $I_B$, $I_C$.

In practice, the node "N" (FIG. 10) is accessible, while the node "n" (FIG. 10) is not always provided. Consequently, voltage measurements $V_{AN}$, $V_{BN}$, $V_{CN}$, and current measurements $I_A$, $I_B$, $I_C$ are available, while voltages $V_{An}$, $V_{Bn}$, $V_{Cn}$ are typically not available. In this case, the phase angle between $V_{AN}$ and $I_A$ can be obtained, while the phase angle between $V_{An}$ and $I_A$ typically cannot be obtained.

The following discloses steps to diagnose current sensors 4 (FIG. 1) for 3-phase 4-wire delta wiring configuration using the phase angles between voltage measurements $V_{AN}$, $V_{BN}$, $V_{CN}$ and current measurements $I_A$, $I_B$, $I_C$, respectively.

Figure 12A:
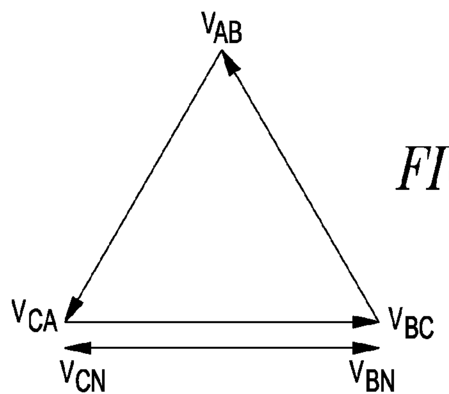
FIGS. 12A-12C are phasor diagrams including a voltage triangle showing relationships between voltage measurements $V_{BN}$, $V_{CN}$ and voltages $V_{AB}$, $V_{BC}$, $V_{CA}$, showing relationships between voltage measurements $V_{AN}$, $V_{BN}$, $V_{CN}$ and voltages $V_{AB}$, $V_{BC}$, $V_{CA}$, and showing relationships between voltages $V_{An}$, $V_{Bn}$, $V_{Cn}$, voltages $V_{AB}$, $V_{BC}$, $V_{CA}$, and voltage measurements $V_{AN}$, $V_{BN}$, $V_{CN}$, respectively, for the embodiment of FIG. 11.
Figure 12B:
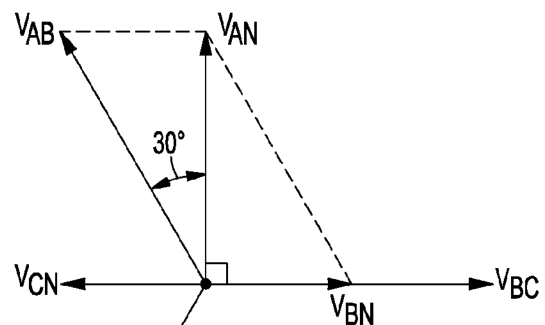

Given balanced three-phase voltages $V_{AB}$, $V_{BC}$, $V_{CA}$, the triangle shown in FIG. 12A is an equilateral triangle. When expressed in phasors, the voltage measurement $V_{BN}$ is in phase with $V_{BC}$, while the voltage measurement $V_{CN}$ is 180° out of phase with respect to $V_{BC}$. In addition, the amplitudes of $V_{BN}$ and $V_{CN}$ are half of the amplitude of $V_{BC}$ (i.e., $|V_{BN}|=|V_{CN}|=|V_{BC}|/2$, wherein $|\cdot|$ denotes the amplitude of a phasor quantity). The voltage measurement $V_{AN}$ is resolved and plotted in FIG. 12B based on the fact that $V_{AN}=V_{AB}+V_{BN}$.

In FIG. 10, the sum of all currents at node "n" is 0 as shown by Equation 16:

$$I_A+I_B+I_C=0 \quad \text{(Eq. 16)}$$

According to FIG. 10, Equation 17 provides:

$$I_A=V_{An}/Z_A, I_B=V_{Bn}/Z_B, I_C=V_{Cn}/Z_C \quad \text{(Eq. 17)}$$

Substituting Equation 17 into Equation 16 yields Equation 18:

$$V_{An}/Z_A+V_{Bn}/Z_B+V_{Cn}/Z_C=0 \quad \text{(Eq. 18)}$$

Equation 18 can be further simplified using the symmetric load assumption in Equation 6 to provide Equation 19:

$$V_{An}+V_{Bn}+V_{Cn}=0 \quad \text{(Eq. 19)}$$

According to FIG. 10, Equations 20 and 21 provide:

$$V_{An}-V_{Bn}-V_{AB} \quad \text{(Eq. 20)}$$

$$V_{Cn}-V_{Bn}=V_{CB}=-V_{BC} \quad \text{(Eq. 21)}$$

Adding Equation 20 to Equation 21 yields Equation 22:

$$V_{An}+V_{Cn}-2V_{Bn}=V_{AB}-V_{BC} \quad \text{(Eq. 22)}$$

According to Equation 19, Equation 23 provides:

$$V_{An}+V_{Cn}--V_{Bn} \quad \text{(Eq. 23)}$$

Substituting Equation 23 into Equation 22 yields Equation 24:

$$V_{Bn}=(-V_{AB}+V_{BC})/3 \quad \text{(Eq. 24)}$$

Figure 12C:
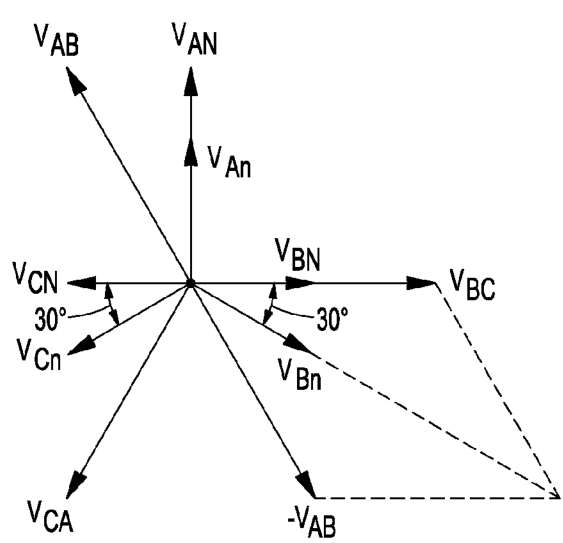

The resulting $V_{Bn}$ is shown in FIG. 12C. Similar relationships can be derived for $V_{An}$ and $V_{Cn}$, and plotted in FIG. 12C. FIG. 12C also shows the relationships between voltage measurements $V_{AN}$, $V_{BN}$, $V_{CN}$ and voltages $V_{An}$, $V_{Bn}$, $V_{Cn}$.

Figure 11B:
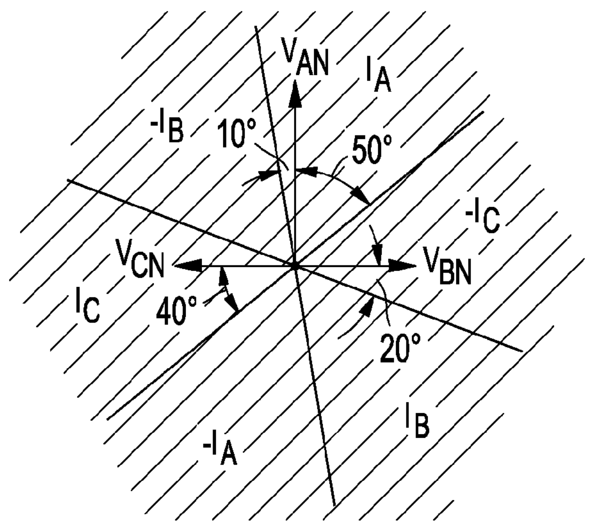

FIG. 11B shows the relationship between voltage measurements $V_{AN}$, $V_{BN}$, $V_{CN}$ and current measurements $I_A$, $I_B$, $I_C$. Table V summarizes cases from FIG. 11B, and shows the current sensor diagnosis 12 (FIG. 1) for 3-phase 4-wire delta wiring configuration 14D. $\varphi_A$ denotes the phase angle between the voltage measurement $V_{AN}$ and the current measurement 5 from a current sensor 4 (FIG. 1) intended to measure phase A current, $\varphi_B$ denotes the phase angle between the voltage measurement $V_{BN}$ and the current measurement 5 from a current sensor 4 intended to measure phase B current, and $\varphi_C$ denotes the phase angle between the voltage measurement $V_{CN}$ and the current measurement 5 from a current sensor 4 intended to measure phase C current.

TABLE V

| $\varphi_A$ | | $\varphi_B$ | | $\varphi_C$ | |
|---|---|---|---|---|---|
| $0° \le \varphi_A < 50°$ or $350° < \varphi_A < 360°$ | $I_A$ | $20° < \varphi_B < 80°$ | $I_B$ | $0° \le \varphi_C < 20°$ or $320° < \varphi_C < 360°$ | $I_C$ |
| $50° < \varphi_A < 110°$ | $-I_C$ | $80° < \varphi_B < 140°$ | $-I_A$ | $20° < \varphi_C < 80°$ | $-I_B$ |
| $110° < \varphi_A < 170°$ | $I_B$ | $140° < \varphi_B < 200°$ | $I_C$ | $80° < \varphi_C < 140°$ | $I_A$ |
| $170° < \varphi_A < 230°$ | $-I_A$ | $200° < \varphi_B < 260°$ | $-I_B$ | $140° < \varphi_C < 200°$ | $-I_C$ |
| $230° < \varphi_A < 290°$ | $I_C$ | $260° < \varphi_B < 320°$ | $I_A$ | $200° < \varphi_C < 260°$ | $I_B$ |
| $290° < \varphi_A < 350°$ | $-I_B$ | $320° < \varphi_B < 360°$ or $0° \le \varphi_B < 20°$ | $-I_C$ | $260° < \varphi_C < 320°$ | $-I_A$ |

According to FIG. 13, Equation 26 provides:

$$I_A=V_{An}/Z_A, I_B=V_{Bn}/Z_B, I_C=V_{Cn}/Z_C \quad \text{(Eq. 26)}$$

Substituting Equation 26 into Equation 25 yields Equation 27:

$$V_{An}/Z_A+V_{Bn}/Z_B+V_{Cn}/Z_C=0 \quad \text{(Eq. 27)}$$

Equation 27 can be further simplified using the symmetric load assumption in Equation 6 to provide Equation 28:

$$V_{An}+V_{Bn}+V_{Cn}=0 \quad \text{(Eq. 28)}$$

According to FIG. 13, Equations 29 and 30 provide:

$$V_{An}=V_{Bn}=V_{AB} \quad \text{(Eq. 29)}$$

$$V_{Cn}-V_{Bn}=V_{CB}=-V_{BC} \quad \text{(Eq. 30)}$$

Adding Equation 29 to Equation 30 yields Equation 31:

$$V_{An}+V_{Cn}-2V_{Bn}=V_{AB}-V_{BC} \quad \text{(Eq. 31)}$$

According to Equation 28, Equation 29 provides:

$$V_{An}+V_{Cn}=-V_{Bn} \quad \text{(Eq. 32)}$$

Substituting Equation 32 into Equation 31 yields Equation 33:

$$V_{Bn}=(-V_{AB}+V_{BC})/3 \quad \text{(Eq. 33)}$$

Figure 14A:
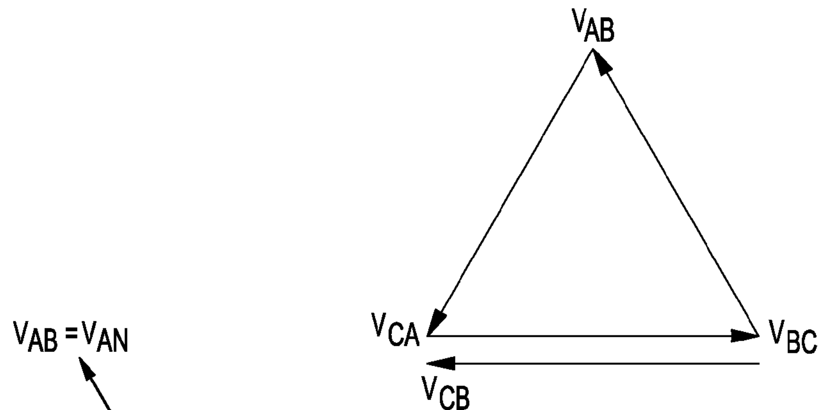
FIGS. 14A-14C are phasor diagrams including a voltage triangle showing relationships between voltages $V_{AB}$, $V_{BC}$, $V_{CA}$, showing relationships between voltage measurements $V_{AN}$, $V_{CN}$ and voltages $V_{AB}$, $V_{CB}$, $V_{CA}$, and showing relationships between voltages $V_{An}$, $V_{Bn}$, $V_{Cn}$, voltages $V_{AB}$, $V_{BC}$, $V_{CA}$, and voltage measurements $V_{AN}$, $V_{CN}$, respectively, in accordance with another embodiment of the disclosed concept.
Figure 14B:
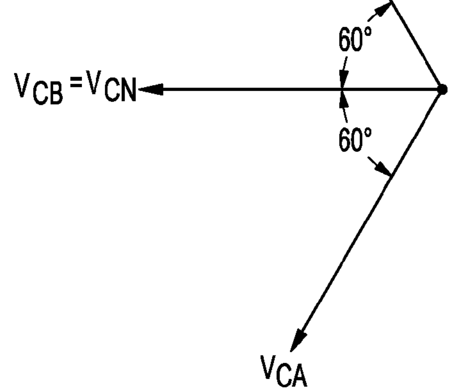
Figure 14C:
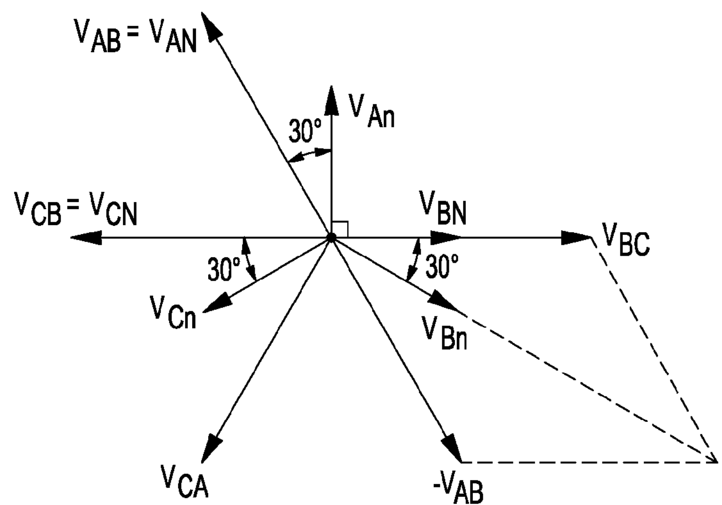
Figure 15A:
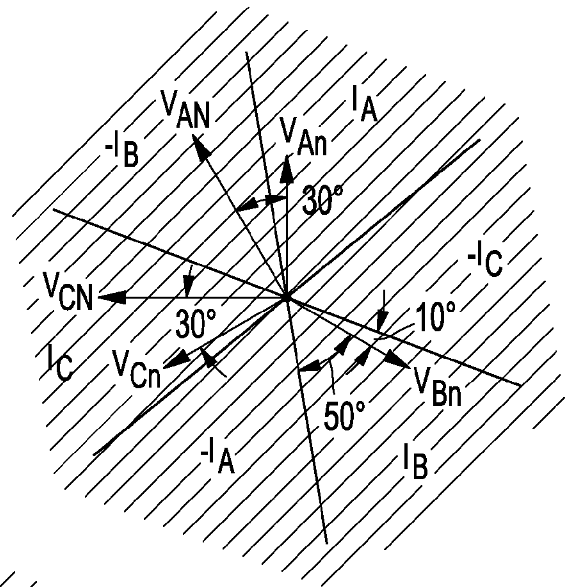
FIGS. 15A and 15B are phasor diagrams showing relationships between voltage measurements $V_{AN}$, $V_{CN}$, and current measurements $I_A$, $I_B$, $I_C$ when voltages $V_{An}$, $V_{Bn}$, $V_{Cn}$ are available or not available, respectively, in accordance with other embodiments of the disclosed concept.
Figure 15B:
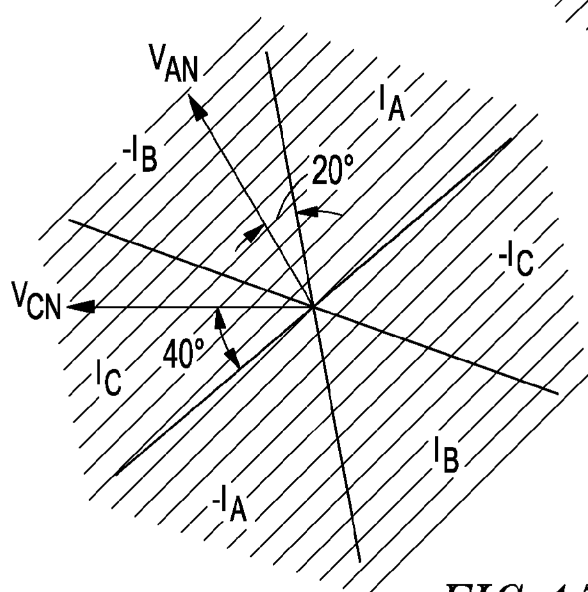

The resulting $V_{Bn}$ is shown in FIG. 14C. Similar relationships can be derived for $V_{An}$ and $V_{Cn}$, and plotted in FIG. 14C, which also shows the relationships between voltage measurements $V_{AN}$, $V_{CN}$ and voltages $V_{An}$, $V_{Bn}$, $V_{Cn}$.

FIG. 13 shows an example 3-phase corner-grounded delta wiring configuration 14E. According to Equation 6 and the load impedance phase angle assumption, FIG. 11A shows the relationships between voltages $V_{An}$, $V_{Bn}$, $V_{Cn}$, and current measurements $I_A$, $I_B$, $I_C$.

In practice, the node "N" (FIG. 13) is accessible, while the node "n" (FIG. 13) is not always provided. Consequently, voltage measurements $V_{AN}$, $V_{CN}$, and current measurements $I_A$, $I_C$ are available, while voltages $V_{An}$, $V_{Bn}$, $V_{Cn}$ are typically not available. In this case, the phase angle between $V_{AN}$ and $I_A$ can be obtained, while the phase angle between $V_{An}$ and $I_A$ typically cannot be obtained. Steps are disclosed, below, to diagnose current sensors 4 (FIG. 1) for the 3-phase corner-grounded delta wiring configuration using the phase angles between voltage measurements $V_{AN}$, $V_{CN}$ and current measurements $I_A$, $I_C$, respectively.

Given balanced 3-phase voltages $V_{AB}$, $V_{BC}$, $V_{CA}$, the triangle shown in FIG. 14A is an equilateral triangle. Because nodes "B" and "N" are connected in the 3-phase corner-grounded delta wiring configuration, voltage measurement $V_{BN}$ is always 0 (i.e., $V_{BN}=0$). For the same reason, $V_{AN}=V_{AB}$ and $V_{CB}=V_{CN}$. The voltage measurements $V_{AN}$, $V_{CN}$ and $V_{CA}$ are plotted in FIG. 14B.

In FIG. 13, the sum of current phasors at node "n" is 0 as per Equation 25:

$$I_A+I_B+I_C0 \quad \text{(Eq. 25)}$$

Combining FIGS. 11A and 14C, FIGS. 15A and 15B show the relationship between voltage measurements $V_{AN}$, $V_{CN}$ and current measurements $I_A$, $I_B$, $I_C$, when voltages $V_{An}$, $V_{Bn}$, $V_{Cn}$ either are or are not available, respectively. Table VI summarizes cases from FIG. 15B, and shows the current sensor diagnosis 12 (FIG. 1) for 3-phase corner-grounded delta wiring configuration. $\varphi_A$ denotes the phase angle between the voltage measurement $V_{AN}$ and the current measurement 5 from a current sensor 4 (FIG. 1) intended to measure phase A current, and $\varphi_C$ denotes the phase angle between the voltage measurement $V_{CN}$ and the current measurement 5 from a current sensor 4 intended to measure phase C current. Because voltage measurement $V_{BN}=0$, the phase angle, $\varphi_B$, between the voltage measurement $V_{BN}$ and the current measurement 5 from a current sensor 4 intended to measure phase B current is not available.

TABLE VI

| $\varphi_A$ | | $\varphi_B$ | | $\varphi_C$ | |
|---|---|---|---|---|---|
| $20° < \varphi_A < 80°$ | $I_A$ | N/A | N/A | $0° \le \varphi_C < 20°$ or $320° < \varphi_C < 360°$ | $I_C$ |
| $80° < \varphi_A < 140°$ | $-I_C$ | N/A | N/A | $20° < \varphi_C < 80°$ | $-I_B$ |
| $140° < \varphi_A < 200°$ | $I_B$ | N/A | N/A | $80° < \varphi_C < 140°$ | $I_A$ |
| $200° < \varphi_A < 260°$ | $-I_A$ | N/A | N/A | $140° < \varphi_C < 200°$ | $-I_C$ |

TABLE VI-continued

| $\varphi_A$ | | $\varphi_B$ | | $\varphi_C$ | |
|---|---|---|---|---|---|
| $260° < \varphi_A < 320°$ | $I_C$ | N/A | N/A | $200° < \varphi_C < 260°$ | $I_B$ |
| $320° < \varphi_A < 360°$ or $0° \leq \varphi_A < 20°$ | $-I_B$ | N/A | N/A | $260° < \varphi_C < 320°$ | $-I_A$ |

In FIG. 13, there are a total of three current sensors and three current-carrying conductors. Therefore, after the current sensor intended to measure phase A current is correctly associated with the phase A current-carrying conductor, and the current sensor intended to measure phase C current is correctly associated with the phase C current-carrying conductor, there is only one current sensor and one current-carrying conductor left. In this case, the current sensor intended to measure phase B current is undoubtedly also correctly associated with the phase B current-carrying conductor.

In terms of the polarity of the current sensor intended to measure phase B current, it is determined by using the relationship from Equation 25. If the sum of all three phase currents is much larger than 0, then the current sensor intended to measure phase B current has a reversed polarity. Otherwise, if the sum of all three phase currents is sufficiently small during normal operation, then the current sensor intended to measure phase B current has a normal polarity.

When either the three-phase voltages are unbalanced or the three-phase loads are not symmetric, the three-phase currents are no longer balanced. If the phase angle between voltage and current is calculated from the real power P, reactive power Q and apparent power S, which are typically values averaged over a few line cycles, then the above disclosure may still be applied when the unbalance is moderate in three-phase currents.

The diagnosis results stage 16 in FIG. 1 receives outputs from the current sensor diagnosis 12. In this stage, the diagnosis results are displayed, and corrective actions are taken based on the diagnosis results.

Figure 16:
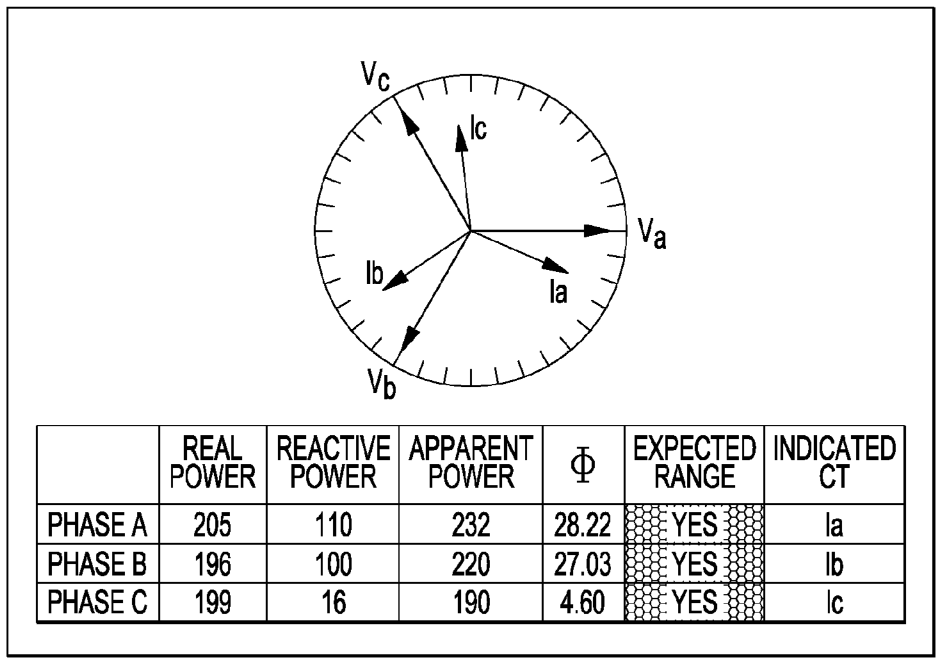
FIGS. 16 and 17A-17C are displays showing examples of the diagnosis results of FIG. 1.

FIG. 16 shows the display of diagnosis results by showing an example phasor diagram as well as a table of relevant parameters and phase values (i.e., $\varphi_A$, $\varphi_B$, and $\varphi_C$) for the three phases. Current sensors that have incorrect polarities or are associated with incorrect phases are indicated in the "Expected Range" column. A "YES" (as shown) means that the current sensor has a correct polarity and is associated with the correct current-carrying conductor, and a "NO" (not shown) means that the current sensor either has an incorrect polarity, or is associated with an incorrect current-carrying conductor, or both.

Figure 17A:
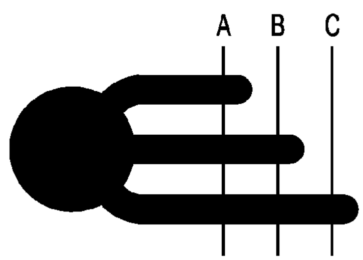
Figure 17B:
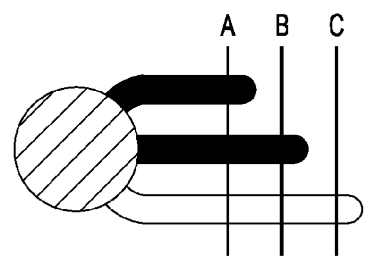
Figure 17C:
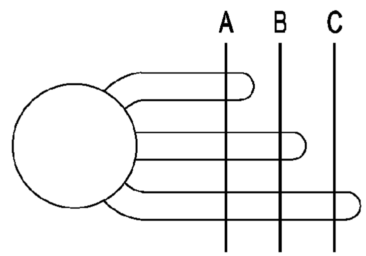

FIGS. 17A-17C show the display of diagnosis results including an example iconic representation having an indicator for each current sensor and a master indicator. The master indicator depicts how many phases are out of range (e.g., without limitation, green (shown as black in FIG. 17A) means zero, yellow (shown in cross-hatch in FIG. 17B) means one or two, and red (shown as white in FIG. 17C) means three). The example master indicator is a circular-shaped icon and the example current sensor indicators have horizontal legs. In FIG. 17A, all current sensors have correct polarities and correct phase associations (e.g., without limitation, as shown by the example icon and horizontal indicators being black representing the color green). In FIG. 17B, at least one current sensor has either an incorrect polarity or an incorrect phase association (e.g., without limitation, as shown by the example icon being in cross-hatch representing the color yellow and the phase C horizontal indicator being white representing the color red). In FIG. 17C, no current sensors have correct polarities or correct phase associations (e.g., without limitation, as shown by the example icon and the three horizontal indicators being white representing the color red).

The diagnosis results can optionally be further displayed using a natural language for ease of understanding, as is shown in Table VII below in the "Status Report" column.

TABLE VII

| Angle | Phase Indicated | Status Report |
|---|---|---|
| $\varphi_A$ | $I_A$ | Current sensor A is correct |
| $\varphi_A$ | $-I_C$ | Current sensor A is swapped with a reversed current sensor C |
| $\varphi_A$ | $I_B$ | Current sensor A is swapped with current sensor B |
| $\varphi_A$ | $-I_A$ | Current sensor A is reversed |
| $\varphi_A$ | $I_C$ | Current sensor A is swapped with current sensor C |
| $\varphi_A$ | $-I_B$ | Current sensor A is swapped with a reversed current sensor B |
| $\varphi_B$ | $I_B$ | Current sensor B is correct |
| $\varphi_B$ | $-I_A$ | Current sensor B is swapped with a reversed current sensor A |
| $\varphi_B$ | $I_C$ | Current sensor B is swapped with current sensor C |
| $\varphi_B$ | $-I_B$ | Current sensor B is reversed |
| $\varphi_B$ | $I_A$ | Current sensor B is swapped with current sensor A |
| $\varphi_B$ | $-I_C$ | Current sensor B is swapped with a reversed current sensor C |
| $\varphi_C$ | $I_C$ | Current sensor C is correct |
| $\varphi_C$ | $-I_B$ | Current sensor C is swapped with a reversed current sensor B |
| $\varphi_C$ | $I_A$ | Current sensor C is swapped with current sensor A |
| $\varphi_C$ | $-I_C$ | Current sensor C is reversed |
| $\varphi_C$ | $I_B$ | Current sensor C is swapped with current sensor B |
| $\varphi_C$ | $-I_A$ | Current sensor C is swapped with a reversed current sensor A |

For the following wiring configurations: (1) 3-Phase 4-Wire Wye (FIG. 3); (2) 3-Phase 3-Wire Delta (FIG. 6); (3) 3-Phase 4-Wire Delta (FIG. 10); and (4) 3-Phase Corner-Grounded Delta (FIG. 13), current sensor A in Table VII is defined as the current sensor intended to measure phase A current. Current sensor B is defined as the current sensor intended to measure phase B current. Current sensor C is defined as the current sensor intended to measure phase C current.

For the 3-Phase 3-Wire Inside Delta (FIG. 8) wiring configuration, current sensor A in Table VII is defined as the current sensor intended to measure current flowing from node "A" to node "B." Current sensor B is defined as the current sensor intended to measure current flowing from node "B" to node "C." Current sensor C is defined as the current sensor intended to measure current flowing from node "C" to node "A."

Figure 18:
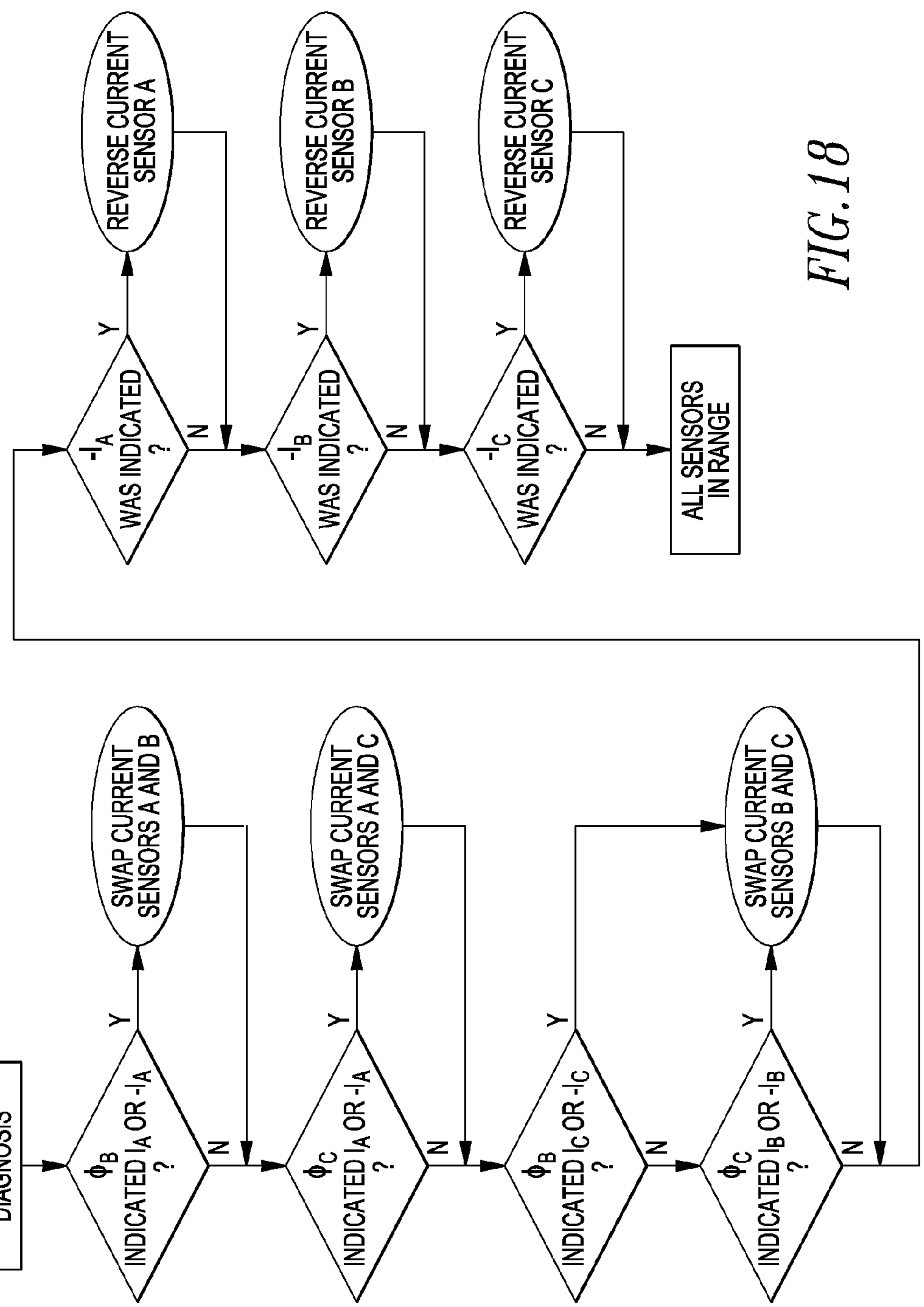
FIG. 18 is a flowchart showing examples of corrective actions in response to the diagnosis results of FIG. 1.

Corrective actions preferably are taken to ensure that all current sensors have correct polarities and phase associations. The corrective actions can be taken, for example, automatically inside electric power or energy meters, or protective relays, or manually by an installation engineer following the displayed status report. The corrective actions are categorized as either swaps or reverses. A swap is done by swapping two current sensors. A reverse is done by reversing the polarity of one single current sensor. FIG. 18 shows a flowchart of an example corrective action.

Example

An example in connection with FIG. 18 is for a 3-phase 4-wire wye wiring configuration (FIG. 3). In this example, the current sensor intended to measure phase A current is mistakenly wired to the phase C current-carrying conductor with a normal polarity; the current sensor intended to measure phase B current is mistakenly wired to the phase A current-carrying conductor with a reversed polarity; and the current sensor intended to measure phase C current is mistakenly wired to the phase B current-carrying conductor with a normal polarity. As a result, the current sensor diagnosis yields the following results according to Table II: $\varphi_A$ indicated $I_C$, $\varphi_B$ indicated $-I_A$, and $\varphi_C$ indicated $I_B$.

Using the above diagnosis result, and following the flowchart in FIG. 18, because $\varphi_B$ indicated $-I_A$, the first logical test "$\varphi_B$ indicated $-I_A$ or $-I_A$" is true, and the first corrective action to "Swap Current Sensors A and B" needs to be taken. Next, because $\varphi_C$ indicated $I_B$, the logical test "$\varphi_C$ indicated $I_A$ or $-I_A$" is false, and the second corrective action to "Swap Current Sensors A and C" does not need to be taken. Third, because $\varphi_C$ indicated $I_B$, the logical test "$\varphi_B$ indicated $I_C$ or $-I_C$ OR $\varphi_C$ indicated $I_B$ or $-I_B$" is true, and the third corrective action to "Swap Current Sensors B and C" needs to be taken. Fourth, because $\varphi_B$ indicated $-I_A$, the logical test "$-I_A$ was indicated" is true, and the fourth corrective action to "Reverse Current Sensor A" needs to be taken. Because $-I_B$ was not indicated and $-I_C$ was not indicated, the fifth and sixth actions do not need to be taken. After all of the logical tests are completed, the diagnosis results stage produces the following corrective actions in this example: (1) swap current sensors A and B; (2) swap current sensors B and C; and (3) reverse current sensor A.

Table VIII, below, summarizes the example discussed above. When the corrective actions are taken in the given order, the current sensor wiring will be corrected.

TABLE VIII

| Current Sensor Diagnosis | Logical Test | Test Result | Corrective Actions |
|---|---|---|---|
| $\varphi_A$ indicated $I_C$ | $\varphi_B$ indicated $I_A$ or $-I_A$ | Yes | 1. Swap current |
| $\varphi_B$ indicated $-I_A$ | $\varphi_C$ indicated $I_A$ or $-I_A$ | No | sensors A and B |
| $\varphi_C$ indicated $I_B$ | $\varphi_B$ indicated $I_C$ or $-I_C$ | Yes | 2. Swap current |
| | OR | | sensors B and C |
| | $\varphi_C$ indicated $I_B$ or $-I_B$ | | 3. Reverse current |
| | $-I_A$ was indicated | Yes | sensor A |
| | $-I_B$ was indicated | No | |
| | $-I_C$ was indicated | No | |

When no corrective actions can be taken automatically by electric power or energy meters, or protective relays via swaps and reverses, for example, in a case when all three current sensors are mistakenly installed on a single phase current-carrying conductor, the diagnosis results stage displays that no automatic corrective actions exist. In this case, corrective actions have to be taken manually by an installation engineer following the displayed status report.

While for clarity of disclosure reference has been made herein to the example display 19 for displaying the diagnosis results 16 (e.g., without limitation, as are discussed in connection with FIGS. 1, 16, 17A-17C and 18), it will be appreciated that such values may be stored in a suitable memory, be printed on hard copy, be computer modified, be sent to a remote display, or be combined with other data. All such processing shall be deemed to fall within the terms "display", "displayed" or "displaying" as employed herein.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A system for a three-phase electric power system having three phases, said system comprising:

a plurality of voltage sensors structured to sense three-phase voltages of said three-phase electric power system;

a plurality of current sensors structured to sense three-phase currents of said three-phase electric power system;

a number of analog-to-digital converters structured to convert the sensed three-phase voltages and the sensed three-phase currents of said three-phase electric power system to corresponding digital values; and a processor configured and programmed to calculate from the corresponding digital values at least two phase angles between voltage and current for at least two of said three phases of said three-phase electric power system, determine a configuration for at least two of said plurality of current sensors based on, for each of said at least two of said plurality of current sensors, a predetermined wiring configuration of said three-phase electric power system and a corresponding one of the at least two phase angles being within a corresponding predetermined angular range, wherein the configuration for each of the at least two of said plurality of current sensors indicates a polarity for each of the at least two of said plurality of current sensors and a phase of the three-phase electric power system with which each of the at least two of said plurality of current sensors is associated, and output the determined configuration for each of the at least two of said plurality of current sensors.

2. The system of claim 1 wherein said processor is further configured and programmed to store the configuration for each of the at least two of said plurality of current sensors for use in troubleshooting or diagnostics of said system.

3. The system of claim 1 wherein said predetermined wiring configuration is a 3-phase 4-wire wye configuration.

4. The system of claim 1 wherein said predetermined wiring configuration is a 3-phase 3-wire delta configuration.

5. The system of claim 1 wherein said predetermined wiring configuration is a 3-phase 3-wire inside delta configuration.

6. The system of claim 1 wherein said predetermined wiring configuration is a 3-phase 4-wire delta configuration.

7. The system of claim 1 wherein said predetermined wiring configuration is a 3-phase corner-grounded delta configuration.

8. The system of claim 1 wherein said processor is part of an electric power meter, an electric energy meter or a protective relay of said three-phase electric power system.

9. The system of claim 1 wherein said processor is further configured and programmed to diagnose for each of said plurality of current sensors whether a corresponding one of said plurality of current sensors has a correct polarity and is associated with a correct one of the three phases of said three-phase electric power system.

10. The system of claim 1 wherein said processor is configured and programmed to output the determined configuration for each of said at least two of said plurality of current sensors by outputting for each of said at least two of the three phases of said three-phase electric power system: (a) the corresponding one of the at least two phase angles; and (b) an indication of whether a corresponding one of the plurality of current sensors has a correct polarity and is operatively associated with a correct one of the three phases of said three-phase electric power system.

11. A method for a three-phase electric power system having three phases, said method comprising:

sensing three-phase voltages of said three-phase electric power system;

employing current sensors and sensing three-phase currents of said three-phase electric power system;

converting the sensed three-phase voltages and the sensed three-phase currents of said three-phase electric power system to corresponding digital values;

calculating from the corresponding digital values at least two phase angles between voltage and current for at least two of said three phases of said three-phase electric power system; and determining with a processor a configuration for at least two of said current sensors based on, for each of said at least two of said current sensors, a predetermined wiring configuration of said three-phase electric power system and a corresponding one of the at least two phase angles being within a corresponding predetermined angular range, wherein the configuration for each of the at least two of said current sensors indicates a polarity for each of the at least two of said current sensors and a phase of the three-phase electric power system with which each of the at least two of said current sensors is associated, and outputting the determined configuration for each of the at least two of said current sensors.

12. The method of claim 11 further comprising:

employing a 3-phase 4-wire wye configuration as said predetermined wiring configuration.

13. The method of claim 11 further comprising:

employing a 3-phase 3-wire delta configuration as said predetermined wiring configuration.

14. The method of claim 11 further comprising:

employing a 3-phase 3-wire inside delta configuration as said predetermined wiring configuration.

15. The method of claim 11 further comprising:

employing a 3-phase 4-wire delta configuration as said predetermined wiring configuration.

16. The method of claim 11 further comprising:

employing a 3-phase corner-grounded delta configuration as said predetermined wiring configuration.

17. The method of claim 11 further comprising:

employing said processor as part of an electric power meter, an electric energy meter or a protective relay of said three-phase electric power system.

18. The method of claim 11 further comprising:

diagnosing for each of said current sensors whether a corresponding one of said current sensors has a correct polarity and is associated with a correct one of said three phases of said three-phase electric power system.

19. The method of claim 11 further comprising:

displaying said determined configuration for each of the at least two of said current sensors by including in the displaying: (a) the corresponding one of the at least two phase angles; and (b) an indication of whether a corresponding one of the current sensors has a correct polarity and is operatively associated with a correct one of said three phases of said three-phase electric power system.

20. The method of claim 11 further comprising:

displaying said determined configuration for each of the at least two of said current sensors by including in the displaying: (a) an indication of whether a corresponding one of the current sensors has a correct polarity and is operatively associated with a correct one of the three phases; or (b) a number of corrective actions for a corresponding number of the current sensors.

21. The method of claim 20 further comprising:

employing as the number of the corrective actions for the corresponding number of the current sensors at least one of: (i) swapping two of the current sensors for two of the three phases; and (ii) reversing one of the current sensors for one of the three phases.

* * * * *